United States Patent
Nomoto et al.

(10) Patent No.: US 8,623,695 B2
(45) Date of Patent: Jan. 7, 2014

(54) METHOD FOR PRODUCING SEMICONDUCTOR DEVICE

(75) Inventors: Akihiro Nomoto, Kanagawa (JP); Hideki Ono, Tokyo (JP)

(73) Assignee: Sony Corporation, Tokyo (JP)

( * ) Notice: Subject to any disclaimer, the term of this patent is extended or adjusted under 35 U.S.C. 154(b) by 19 days.

(21) Appl. No.: 12/888,488

(22) Filed: Sep. 23, 2010

(65) Prior Publication Data

US 2011/0081746 A1    Apr. 7, 2011

(30) Foreign Application Priority Data

Oct. 2, 2009   (JP) .............................. P2009-230234

(51) Int. Cl.
    *H01L 51/40*   (2006.01)
(52) U.S. Cl.
    USPC ......... 438/99; 438/149; 257/40; 257/E51.017
(58) Field of Classification Search
    USPC ................ 438/99, 149; 257/40, E51.017
    See application file for complete search history.

(56) References Cited

U.S. PATENT DOCUMENTS

| | | | | |
|---|---|---|---|---|
| 7,494,923 B2* | 2/2009 | Yamamoto et al. | ........... | 438/662 |
| 7,732,248 B2* | 6/2010 | Maekawa | ......... | 438/99 |
| 7,749,825 B2* | 7/2010 | Honda | ......... | 438/158 |
| 7,776,645 B2* | 8/2010 | Nagayama et al. | ............ | 438/99 |
| 2006/0246620 A1* | 11/2006 | Nagayama et al. | ............ | 438/99 |
| 2007/0031990 A1* | 2/2007 | Maekawa | ........ | 438/99 |
| 2010/0264408 A1* | 10/2010 | Bale et al. | ........ | 257/40 |

FOREIGN PATENT DOCUMENTS

| | | |
|---|---|---|
| JP | 2006-41317 | 2/2006 |
| JP | 2008-300580 | 12/2008 |

* cited by examiner

*Primary Examiner* — Jarrett Stark
(74) *Attorney, Agent, or Firm* — K&L Gates LLP

(57) ABSTRACT

A method for producing a semiconductor device includes the steps of forming an organic semiconductor layer on a substrate; forming a protective pattern on the organic semiconductor layer; and patterning the organic semiconductor layer by dissolving, in an organic solvent, or subliming the organic semiconductor layer using the protective pattern as a mask.

13 Claims, 6 Drawing Sheets

METHOD FOR PRODUCING SEMICONDUCTOR DEVICE

CROSS REFERENCES TO RELATED APPLICATIONS

The present application claims priority to Japanese Priority Patent Application JP 2009-230234 filed in the Japan Patent Office on Oct. 2, 2009, the entire content of which is hereby incorporated by reference.

BACKGROUND

The present application relates to methods for producing semiconductor devices, and particularly to a method for producing a semiconductor device including a patterned organic semiconductor layer.

Recently, semiconductor devices including organic semiconductor layers as active layers have attracted attention as semiconductor devices that can be produced with large area at low cost. One problem with the production of such organic semiconductor devices is that, when an organic semiconductor layer is patterned for device isolation by etching using a photoresist as a mask, solvent contained in the photoresist damages the organic semiconductor layer, thus impairing the electrical properties thereof.

Accordingly, a method has been proposed in which a protective film is formed on an organic semiconductor layer using a material having solvent resistance before a mask pattern is formed on the protective film using a photoresist. In this case, the protective film is etched using the photoresist as a mask before the organic semiconductor layer is etched with oxygen plasma (see Japanese Unexamined Patent Application Publication No. 2006-41317 (particularly, paragraphs 0057 and 0058)).

In addition, a method has been proposed in which an organic semiconductor layer is formed in a predetermined pattern by printing, such as inkjet printing, to avoid the effect of solvent contained in a photoresist on the organic semiconductor layer. In this case, if a protective film containing, for example, a siloxane compound is formed so as to cover the printed pattern of the organic semiconductor layer, it prevents the organic semiconductor layer from being damaged in the subsequent process (see Japanese Unexamined Patent Application Publication No. 2008-300580 (particularly, paragraphs 0174 to 0176)).

SUMMARY

However, a method in which an organic semiconductor layer is etched using a photoresist with a protective film therebetween, as typified by the one disclosed in Japanese Unexamined Patent Application Publication No. 2006-41317 (particularly, paragraphs 0057 and 0058, chemically degrades the etched surface of the organic semiconductor layer. A degraded layer formed by the degradation contributes to parasitic capacitance or impairs the characteristics of the organic semiconductor layer.

On the other hand, a method in which an organic semiconductor layer is printed in a predetermined pattern, as typified by the one disclosed in Patent Japanese Unexamined Patent Application Publication No. 2008-300580 (particularly, paragraphs 0174 to 0176, causes a nonuniform surface condition in the printed pattern of the organic semiconductor layer. For example, if a pattern of organic semiconductor layer is printed by inkjet printing, the thickness thereof varies as a result of the phenomenon, called the coffee stain phenomenon, by which the organic semiconductor layer becomes thicker at the edges thereof than in the center thereof, depending on the pattern size. This thickness variation impairs device characteristics.

Accordingly, it is desirable to provide a method for producing a semiconductor device by patterning an organic semiconductor layer while maintaining uniform surface condition and film quality so that the device can be isolated while ensuring excellent characteristics.

A method for producing a semiconductor device according to an embodiment includes the steps of forming an organic semiconductor layer on a substrate; forming a protective pattern on the organic semiconductor layer; and patterning the organic semiconductor layer by dissolving, in an organic solvent, or subliming the organic semiconductor layer using the protective pattern as a mask.

Because this method employs a procedure in which the organic semiconductor layer formed on the substrate is patterned, the organic semiconductor layer has uniform surface condition. In addition, because the organic semiconductor layer is patterned by dissolving, in an organic solvent, or subliming the organic semiconductor layer, the patterned surface of the organic semiconductor layer is not degraded, so that the pattern of the organic semiconductor layer, including the edges thereof, has uniform film quality.

According to the embodiment, as described above, the organic semiconductor layer can be patterned while maintaining uniform surface condition and film quality so that the device can be isolated while ensuring excellent characteristics.

Additional features and advantages are described herein, and will be apparent from the following Detailed Description and the figures.

DETAILED DESCRIPTION

The present application is described below in detail with reference to the drawings according to an embodiment. The detailed description is provided as follows:

1. First embodiment (production of semiconductor device including bottom-contact, bottom-gate thin-film transistor)

2. Second embodiment (production of semiconductor device including top-contact, bottom-gate thin-film transistor)

3. Third embodiment (production of semiconductor device including bottom-contact, bottom-gate thin-film transistor including organic semiconductor layer formed by phase separation)

4. Fourth embodiment (production of semiconductor device including top-contact, bottom-gate thin-film transistor including organic semiconductor layer formed by phase separation)

5. Fifth embodiment (production of semiconductor device including bottom-contact, bottom-gate thin-film transistor including two protective films)

In the embodiments below, common elements are denoted by the same reference numerals, and a redundant description thereof will be omitted.

1. First Embodiment

FIGS. 1A to 1E and FIG. 2 are sectional views illustrating the steps of a method for producing a semiconductor device including a bottom-contact, bottom-gate thin-film transistor according to a first embodiment. The first embodiment will now be described with reference to the drawings.

Figure 1A:
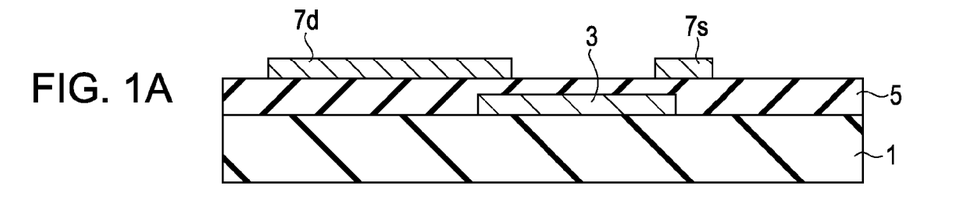
FIGS. 1A to 1E are sectional views illustrating the steps of a method for producing a semiconductor device according to a first embodiment.

Referring to FIG. 1A, first, by a common procedure, a gate electrode 3 is formed on a substrate 1, a gate insulator 5 is formed so as to cover the gate electrode 3, and a source electrode 7s and a drain electrode 7d are formed on the gate electrode 3.

The substrate 1 may be any substrate having insulation properties at least on a surface thereof, for example, a substrate of a plastic such as polyethersulfone (PES), poly(ethylene naphthalate) (PEN), poly(ethylene terephthalate) (PET), or polycarbonate (PC). The substrate 1 may also be, for example, a resin-laminated foil substrate of a metal such as stainless steel, or a glass substrate. For flexibility, a plastic substrate or a metal foil substrate is used.

To form the pattern of the gate electrode 3, for example, first, a film of a metal such as gold (Au), platinum (Pt), silver (Ag), tungsten (W), tantalum (Ta), molybdenum (Mo), aluminum (Al), chromium (Cr), titanium (Ti), copper (Cu), or nickel (Ni) is formed. This metal film is formed by, for example, sputtering, evaporation, or plating. A resist pattern (not shown) is then formed on the metal film by photolithography and is used as a mask to etch the metal film, thus forming the gate electrode 3. The gate electrode 3 may be formed by any method and, for example, printing may instead be applied.

The gate insulator 5 is formed by chemical vapor deposition (CVD) or sputtering if the gate insulator 5 is formed of an inorganic material such as silicon oxide or nitrogen oxide. On the other hand, the gate insulator 5 is formed by coating or printing if the gate insulator 5 is formed of an organic polymer material such as polyvinylphenol (PVP), poly(methyl methacrylate) (PMMA), polyimide, or fluoropolymer. In this embodiment, for example, the gate insulator 5 is formed by coating using crosslinked PVP.

The source electrode 7s and the drain electrode 7d are formed in the same manner as the gate electrode 3. The source electrode 7s and the drain electrode 7d are formed such that the respective edges thereof face each other on both sides of the gate electrode 3 in the width direction thereof. In this embodiment, for example, the source electrode 7s and the drain electrode 7d are formed of gold (Au).

Figure 1B:
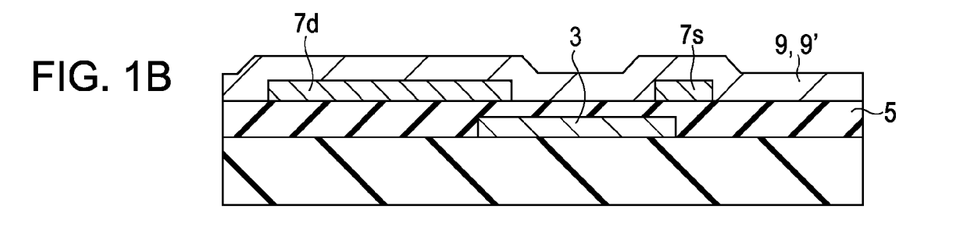

Referring then to FIG. 1B, an organic semiconductor layer 9 is formed over the entire surface of the substrate 1 on which the source electrode 7s and the drain electrode 7d are formed. In this embodiment, particularly, the organic semiconductor layer 9 is formed using an organic semiconductor material soluble in an organic solvent A. For example, if the organic solvent A used is 1,2,3,4-tetrahydronaphthalene, the organic semiconductor layer 9 is formed using ethylphenylperixanthenoxanthene (EtPhPXX), which is soluble in 1,2,3,4-tetrahydronaphthalene.

The organic semiconductor layer 9 can be formed by a vacuum process such as vacuum evaporation or CVD or a coating process such as spin coating, slit coating, or gravure coating. A vacuum process is advantageous in that the resultant film has minor in-plane variations in thickness and quality and a wide range of choices of substrate materials and organic semiconductor materials are available because the process does not depend on the wettability of the substrate. A coating process, on the other hand, is advantageous in that it is a simple, low-cost process and a film can be formed on a large substrate.

Figure 1C:
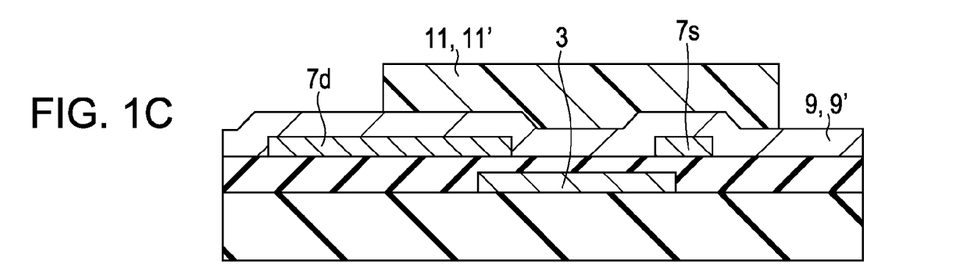

Referring then to FIG. 1C, a protective pattern 11 is formed on the organic semiconductor layer 9 so as to overlap the gate electrode 3 between the source electrode 7s and the drain electrode 7d. In this step, it is important to form the protective pattern 11 without damaging the organic semiconductor layer 9 previously formed. Accordingly, for example, the protective pattern 11 is formed by printing using a solvent B that does not dissolve or degrade the organic semiconductor layer 9 and a material soluble in the solvent B.

The solvent B used may be water or a fluorinated solvent. If the solvent B used is water, the protective pattern 11 is formed by printing using a water-based resin such as poly (vinyl alcohol) (PVA) or cyanoethylpullulan (CyEPL). On the other hand, if the solvent B used is a fluorinated solvent, the protective pattern 11 is formed by printing using an amorphous fluoropolymer such as CYTOP (registered trademark).

The printing process used for forming the protective pattern 11 is not particularly limited, and an appropriate printing process may be selected from, for example, screen printing, flexography, gravure printing, offset printing, inkjet printing, and dry stamping. By such a printing process, the protective pattern 11 can be formed at high throughput and low cost. In particular, by dry stamping, a thin and fine protective pattern 11 can be formed and, if the protective pattern 11 is left, the upper layers can be easily formed because the protective pattern 11 is thin and flat.

Figure 1D:
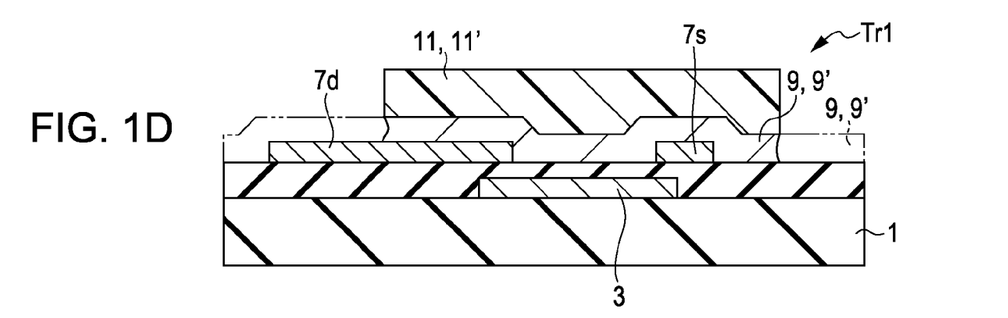

Referring then to FIG. 1D, the organic semiconductor layer 9 is patterned by dissolving it in the organic solvent A using the protective pattern 11 as a mask. If the organic semiconductor layer 9 is formed of EtPhPXX, the organic semiconductor layer 9 is patterned by dissolving it using 1,2,3,4-tetrahydronaphthalene as the organic solvent A.

In this step, the organic solvent A is supplied to the organic semiconductor layer 9 by a method such as dipping, spin coating, or spraying. The organic semiconductor material can be collected for reuse from the organic solvent A in which the organic semiconductor layer 9 is dissolved by purification.

Thus, a bottom-contact, bottom-gate thin-film transistor Tr1 is formed on the substrate 1. The thin-film transistor Tr1 is isolated from other thin-film transistors and other devices formed on the substrate 1 using the organic semiconductor layer 9.

Figure 1E:
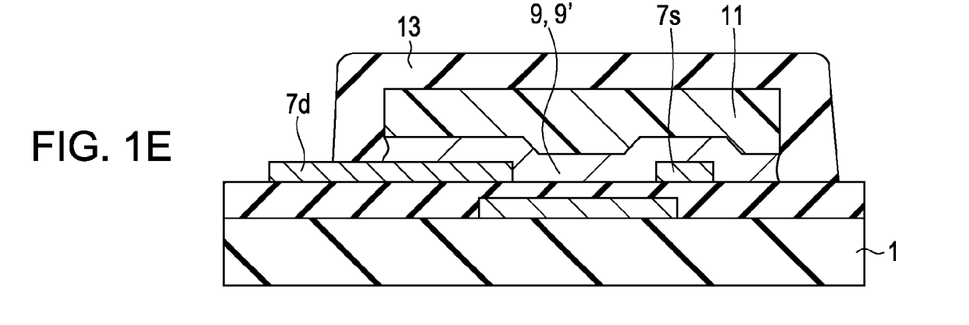

Referring then to FIG. 1E, while the protective pattern 11 is left on the organic semiconductor layer 9, an insulating protective film 13 may be formed in a pattern covering the protective pattern 11 and the side surfaces of the organic semiconductor layer 9. In the formation of the protective film 13, the protective pattern 11 serves as a mask to prevent damage to the organic semiconductor layer 9. Accordingly, the protective film 13 may be formed by any method. In addition, the protective film 13 is formed in a pattern in which an appropriate portion of the source electrode 7s, the drain electrode 7d, or an electrode line formed of the same layer as the source electrode 7s and the drain electrode 7d is exposed. In this embodiment, for example, the pattern of the protective film 13 is formed by printing.

Figure 2:
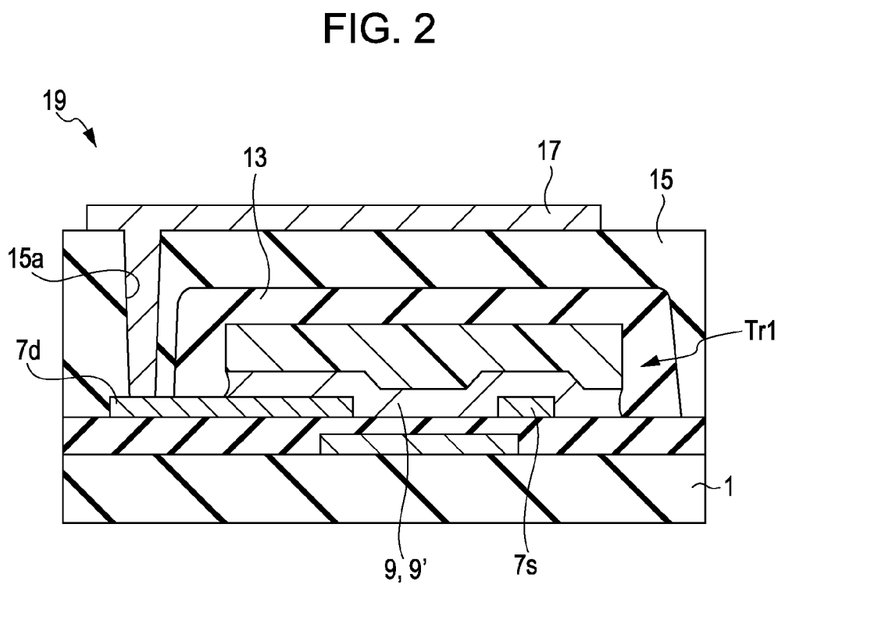
FIG. 2 is another sectional view illustrating the steps of the method for producing a semiconductor device according to the first embodiment.

Thereafter, for example, as shown in FIG. 2, an interlayer insulator 15 is formed so as to cover the entire surface of the substrate 1, a via hole 15a is formed in the interlayer insulator 15 so as to reach the drain electrode 7d, and an interconnect line 17 is formed as a third layer on the interlayer insulator 15. For example, the interlayer insulator 15 may be a photoresist film formed by spin coating, and the via hole 15a may be formed in the photoresist film by photolithography. In this case, the protective film 13 protects the side surfaces of the organic semiconductor layer 9 to prevent the solvent contained in the photoresist from damaging the organic semiconductor layer 9. The interlayer insulator 15 may also be formed in a pattern having the via hole 15a by screen printing. The interconnect line 17 is formed in a pattern connected to the drain electrode 7d of the thin-film transistor Tr via the via hole 15a. The interconnect line 17 may be formed by forming an interconnect film by evaporation and patterning the interconnect film by etching using a resist pattern formed by lithography as a mask, or may be formed by printing such as screen printing or inkjet printing.

Thus, a semiconductor device 19 is completed. If the semiconductor device 19 is used as a backplane of a display, the interconnect line 17 may be formed as a pixel electrode.

As described using FIG. 1D, the first embodiment employs a procedure in which the organic semiconductor layer 9 formed on the substrate 1 is patterned using the protective pattern 11 as a mask. Accordingly, the patterned organic semiconductor layer 9 has a more uniform surface condition than a pattern of organic semiconductor layer formed by printing. In addition, because the organic semiconductor layer 9 is patterned by dissolving it in an organic solvent, no degraded layer is formed on the patterned surface, so that the pattern of the organic semiconductor layer 9, including the edges thereof, has uniform film quality. As a result, the semiconductor device 19 can be isolated while ensuring excellent characteristics.

Modification of First Embodiment

Next, a modification of the first embodiment will be described with reference to FIG. 1.

First, in the same manner as described in the first embodiment using FIG. 1A, the gate electrode 3, the gate insulator 5, the source electrode 7s, and the drain electrode 7d are formed on the substrate 1.

Referring then to FIG. 1B, an organic semiconductor layer 9' is formed over the entire surface of the substrate 1 on which the source electrode 7s and the drain electrode 7d are formed. In this step, it is important to form the organic semiconductor layer 9' using a material resistant to the subsequent process of forming a protective pattern and having a lower sublimation temperature than the constituent material of the protective pattern.

As in the first embodiment, the organic semiconductor layer 9' can be formed by a vacuum process such as vacuum evaporation or CVD or a coating process such as spin coating, slit coating, or gravure coating. In this modification, for example, the organic semiconductor layer 9' is formed by vacuum evaporation using pentacene.

In the next step shown in FIG. 1C, a protective pattern 11' is formed on the organic semiconductor layer 9' so as to overlap the gate electrode 3 between the source electrode 7s and the drain electrode 7d. In this step, as in the first embodiment, it is important to form the protective pattern 11' without damaging the organic semiconductor layer 9' previously formed. At the same time, it is important to form the protective pattern 11' using a material having a higher sublimation temperature than the organic semiconductor layer 9'.

As in the first embodiment, the protective pattern 11' is formed by printing using a solvent B that does not dissolve or degrade the organic semiconductor layer 9' and a material soluble in the solvent B. The solvent B used may be water or a fluorinated solvent. If the solvent B used is water, the protective pattern 11' is formed by printing using a water-based resin such as poly(vinyl alcohol) (PVA) or cyanoethylpullulan (CyEPL). On the other hand, if the solvent B used is a fluorinated solvent, the protective pattern 11' is formed by printing using an amorphous fluoropolymer such as CYTOP (registered trademark). By printing, the protective pattern 11' can be formed at high throughput and low cost. In particular, by dry stamping, a thin and fine protective pattern 11' can be formed and, if the protective pattern 11' is left, the upper layers can be easily formed because the protective pattern 11' is thin and flat.

In the next step shown in FIG. 1D, the organic semiconductor layer 9' is patterned by subliming it at a temperature lower than the sublimation temperature of the protective pattern 11' using the protective pattern 11' as a mask. If the protective pattern 11' is formed of poly(vinyl alcohol) (PVA) and the organic semiconductor layer 9' is formed of pentacene, the organic semiconductor layer 9' is annealed in a vacuum oven set to 150° C. for 12 hours. Thus, the organic semiconductor layer 9', formed of pentacene, is removed by sublimation from the region where the protective pattern 11', formed of poly(vinyl alcohol) (PVA), is not provided, thus forming the patterned organic semiconductor layer 9'.

The organic semiconductor material (pentacene) can be collected for reuse from gas generated in the vacuum oven during the annealing.

Thus, the bottom-contact, bottom-gate thin-film transistor Tr1 is formed on the substrate 1. The thin-film transistor Tr1 is isolated from other thin-film transistors and other devices formed using the organic semiconductor layer 9'.

Thereafter, in the same manner as described in the first embodiment using FIGS. 1E and 2, while the protective pattern 11' is left on the organic semiconductor layer 9' where appropriate, the insulating protective film 13 may be formed in a pattern covering the side surfaces of the organic semiconductor layer 9'. The interlayer insulator 15 is then formed so as to cover the entire surface of the substrate 1, the via hole 15a is formed in the interlayer insulator 15 so as to reach the drain electrode 7d, and the interconnect line 17 is formed as a third layer on the interlayer insulator 15. Thus, the semiconductor device 19 is completed. If the semiconductor device 19 is used as a backplane of a display, the interconnect line 17 may be formed as a pixel electrode.

As described above using FIG. 1D, the modification of the first embodiment employs a procedure in which the organic semiconductor layer 9' formed on the substrate 1 is patterned using the protective pattern 11' as a mask. Accordingly, the patterned organic semiconductor layer 9' has a more uniform surface condition than a pattern of organic semiconductor layer formed by printing. In addition, because the organic semiconductor layer 9' is patterned by sublimation, no degraded layer is formed on the patterned surface, so that the pattern of the organic semiconductor layer 9', including the edges thereof, has uniform film quality. As a result, as in the first embodiment, the semiconductor device 19 can be isolated while ensuring excellent characteristics.

2. Second Embodiment

FIGS. 3A to 3E are sectional views illustrating the steps of a method for producing a semiconductor device including a top-contact, bottom-gate thin-film transistor according to a second embodiment. The second embodiment will now be described with reference to the drawings.

Figure 3A:
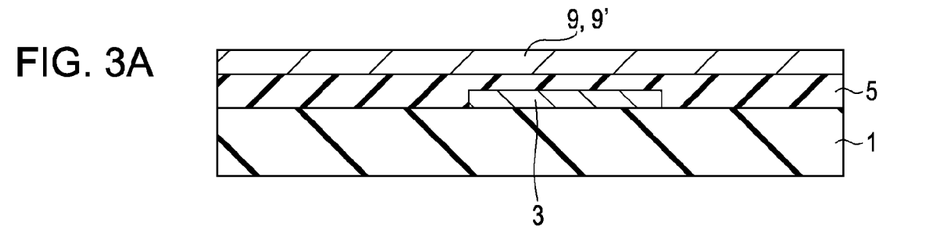
FIGS. 3A to 3E are sectional views illustrating the steps of a method for producing a semiconductor device according to a second embodiment.

Referring to FIG. 3A, first, by a common procedure, as in the first embodiment, the gate electrode 3 is formed on the substrate 1, and the gate insulator 5 is formed so as to cover the gate electrode 3.

Subsequently, the organic semiconductor layer 9 is formed on the gate insulator 5. As in the first embodiment, the organic semiconductor layer 9 is formed by an appropriately selected method using an organic semiconductor material soluble in a particular organic solvent A. In this embodiment, for example, if the organic solvent A used is 1,2,3,4-tetrahydronaphthalene, the organic semiconductor layer 9 is formed using ethylphenylperixanthenoxanthene (EtPhPXX), which is soluble in 1,2,3,4-tetrahydronaphthalene.

Figure 3B:
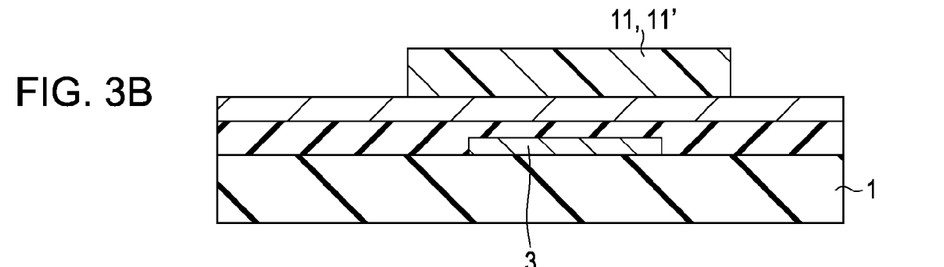

Referring then to FIG. 3B, the protective pattern 11 is formed on the organic semiconductor layer 9 so as to overlap the gate electrode 3. As in the first embodiment, it is important to form the protective pattern 11 without damaging the organic semiconductor layer 9, and the protective pattern 11 is formed by printing using a solvent B that does not dissolve or degrade the organic semiconductor layer 9. For example, if the solvent B used is water, the protective pattern 11 is formed by printing using a water-based resin such as poly(vinyl alcohol) (PVA) or cyanoethylpullulan (CyEPL). On the other hand, if the solvent B used is a fluorinated solvent, the protective pattern 11 is formed by printing using an amorphous fluoropolymer such as CYTOP (registered trademark). By printing, the protective pattern 11 can be formed at high throughput and low cost. In particular, by dry stamping, a thin and fine protective pattern 11 can be formed.

Figure 3C:
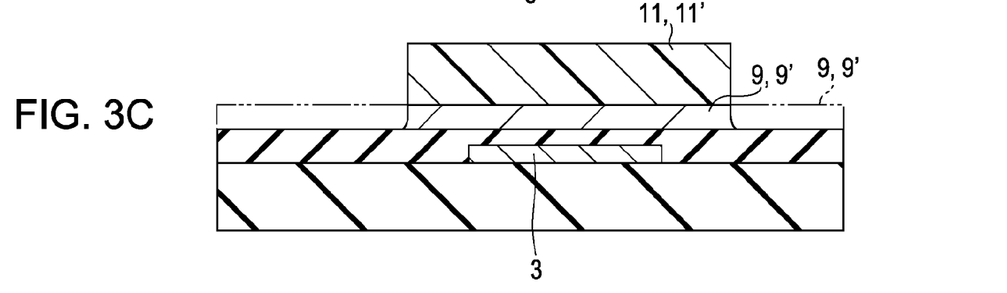

Referring then to FIG. 3C, the organic semiconductor layer 9 is patterned by dissolving it in the organic solvent A using the protective pattern 11 as a mask. If the organic semiconductor layer 9 is formed of EtPhPXX, the organic semiconductor layer 9 is patterned by dissolving it using 1,2,3,4-tetrahydronaphthalene as the organic solvent A. In this step, for example, the organic solvent A is supplied to the organic semiconductor layer 9 by a method such as dipping, spin coating, or spraying. The organic semiconductor material can be collected for reuse from the organic solvent A in which the organic semiconductor layer 9 is dissolved by purification.

After the patterning of the organic semiconductor layer 9, the protective pattern 11 is removed. In this step, the solvent B described above is used to remove the protective pattern 11 by dissolving it in the solvent B without damaging the organic semiconductor layer 9. In this step, any solvent that can dissolve the protective pattern 11 without damaging the organic semiconductor layer 9 may be used instead of the solvent B used for printing to remove the protective pattern 11. In addition, the constituent material of the protective pattern 11 can be collected for reuse from the solvent B in which the protective pattern 11 is dissolved by purification.

Figure 3D:
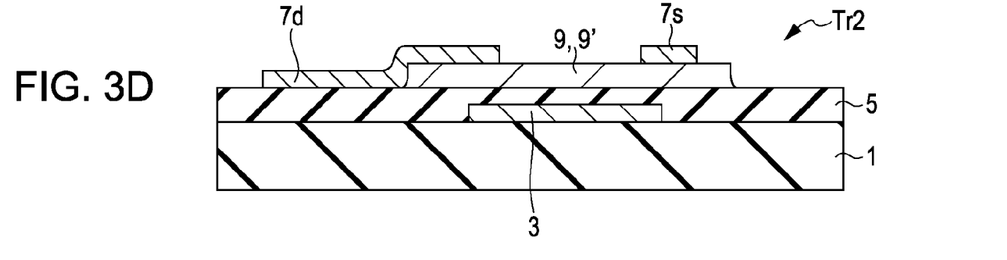
Figure 3E:
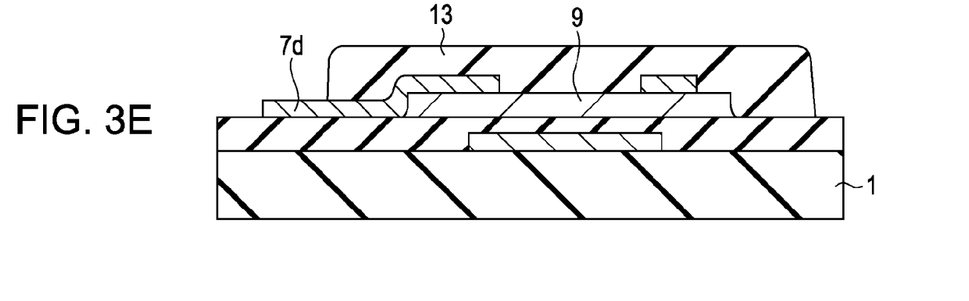

Referring then to FIG. 3D, the source electrode 7s and the drain electrode 7d are formed. The source electrode 7s and the drain electrode 7d are formed on the organic semiconductor layer 9 such that the respective edges thereof face each other with the gate electrode 3 therebetween on both sides of the gate electrode 3 in the width direction thereof. The source electrode 7s and the drain electrode 7d can be formed by printing or another patterning process, such as metal evaporation using a metal mask or screen printing using a silver (Ag) paste.

Thus, a top-contact, bottom-gate thin-film transistor Tr2 is formed on the substrate 1. The thin-film transistor Tr2 is isolated from other thin-film transistors and other devices formed on the substrate 1 using the organic semiconductor layer 9.

Thereafter, in the same manner as described in the first embodiment using FIGS. 1E and 2, the insulating protective film 13 may be formed so as to cover the organic semiconductor layer 9 where appropriate. An interlayer insulator is then formed so as to cover the entire surface of the substrate 1, a via hole is formed in the interlayer insulator so as to reach the drain electrode 7d, and an interconnect line is formed as a third layer on the interlayer insulator. Thus, a semiconductor device is completed. If the semiconductor device is used as a backplane of a display, the interconnect line may be formed as a pixel electrode.

As described above using FIG. 3C, the second embodiment employs a procedure in which the organic semiconductor layer 9 formed on the substrate 1 is patterned by dissolving it using the protective pattern 11 as a mask. Accordingly, as in the first embodiment, a pattern of organic semiconductor layer 9 having uniform surface condition and film quality can be formed. As a result, the semiconductor device can be isolated while ensuring excellent characteristics.

Modification of Second Embodiment

The modification of the first embodiment can also be applied to the second embodiment described above. In this case, it is immaterial whether the organic semiconductor layer 9' formed in the step described using FIG. 3A is soluble in the organic solvent A. However, as in the modification of the first embodiment, the organic semiconductor layer 9' is formed using a material resistant to the subsequent process of forming a protective pattern and having a lower sublimation temperature than the protective pattern.

In the next step shown in FIG. 3B, as in the modification of the first embodiment, it is important to form the protective pattern 11' without damaging the organic semiconductor layer 9' previously formed and using a material having a higher sublimation temperature than the organic semiconductor layer 9'.

In the next step shown in FIG. 3C, as in the modification of the first embodiment, the organic semiconductor layer 9' is patterned by subliming it at a temperature lower than the sublimation temperature of the protective pattern 11' using the protective pattern 11' as a mask.

Thereafter, as in the second embodiment, a semiconductor device including the top-contact, bottom-gate thin-film transistor Tr2 is completed.

As described above using FIG. 3C, the modification of the second embodiment employs a procedure in which the organic semiconductor layer 9' formed on the substrate 1 is patterned by subliming it using the protective pattern 11' as a mask. Accordingly, as in the first embodiment, a pattern of organic semiconductor layer 9' having uniform surface condition and film quality can be formed. As a result, the semiconductor device can be isolated while ensuring excellent characteristics.

3. Third Embodiment

FIGS. 4A to 4E are sectional views illustrating the steps of a method for producing a semiconductor device including a bottom-contact, bottom-gate thin-film transistor according to a third embodiment. The third embodiment differs from the first embodiment in that an organic semiconductor layer is formed by phase separation. The third embodiment will now be described with reference to the drawings.

Figure 4A:
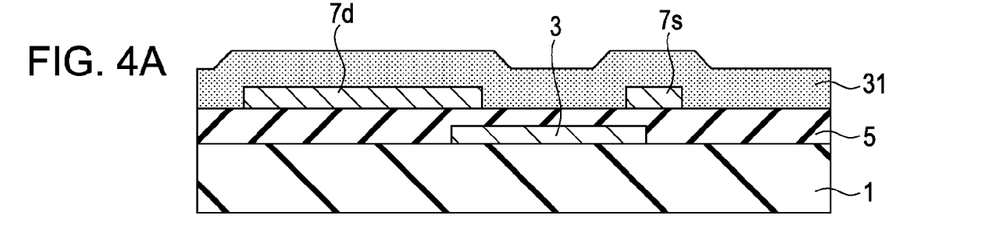
FIGS. 4A to 4E are sectional views illustrating the steps of a method for producing a semiconductor device according to a third embodiment.

Referring to FIG. 4A, first, by a common procedure, as in the first embodiment, the gate electrode 3 is formed on the substrate 1, the gate insulator 5 is formed so as to cover the gate electrode 3, and the source electrode 7s and the drain electrode 7d are formed.

Subsequently, a mixed ink layer 31 containing an organic semiconductor material is formed on the gate insulator 5 on which the source electrode 7s and the drain electrode 7d are formed. The mixed ink layer 31 contains the intended organic semiconductor material and another organic material (mixed material). The combination of these materials is selected so that the organic semiconductor material is separated downward toward the gate insulator 5 (substrate 1) in the subsequent phase separation step. In this embodiment, the organic semiconductor material used is 6,13-bis(triisopropylsilylethynyl)pentacene (TIPS pentacene), and the organic material used is poly-α-methylstyrene (PaMS). The mixed ink layer 31 is formed by coating using an ink prepared by dissolving the above materials in toluene.

Figure 4B:
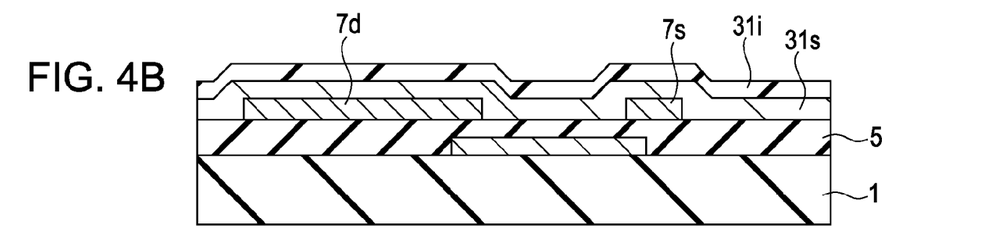

Referring then to FIG. 4B, the mixed ink layer 31 is subjected to phase separation into the organic semiconductor material and the organic material, thus forming a stack of an organic semiconductor layer 31s, formed of the organic semiconductor material, on the substrate 1 side and an insulating layer 31i, formed of the organic material, on top of the organic semiconductor layer 31s. The phase separation is performed by drying the mixed ink layer 31.

Figure 4C:
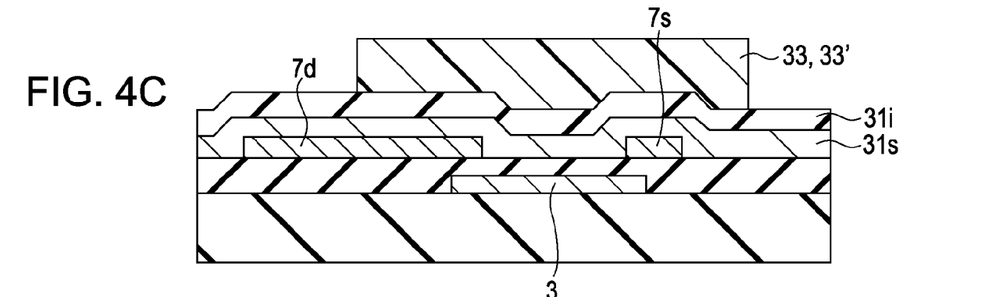

Referring then to FIG. 4C, a protective pattern 33 is formed on the stack of the organic semiconductor layer 31s and the insulating layer 31i so as to overlap the gate electrode 3 between the source electrode 7s and the drain electrode 7d. During this step, the organic semiconductor layer 31s is protected by the insulating layer 31i. Accordingly, the protective pattern 33 may be formed without taking into account process damage to the organic semiconductor layer 31s. That is, the protective pattern 33 may be formed of a material resistant to the subsequent process of removing the insulating layer 31i and the organic semiconductor layer 31s.

The protective pattern 33 is formed by, for example, printing. In this embodiment, as in the first embodiment, the protective pattern 33 is formed by printing using a water-based resin such as poly(vinyl alcohol) (PVA) or cyanoethylpullulan (CyEPL) or an amorphous fluoropolymer, such as CYTOP (registered trademark), soluble in a fluorinated solvent. By printing, the protective pattern 33 can be formed at high throughput and low cost. In particular, by dry stamping, a thin and fine protective pattern 33 can be formed and, if the protective pattern 33 is left, the upper layers can be easily formed because the protective pattern 33 is thin and flat.

The printing process used in this step is not particularly limited, and an appropriate printing process may be selected from, for example, screen printing, flexography, gravure printing, offset printing, inkjet printing, and dry stamping.

Figure 4D:
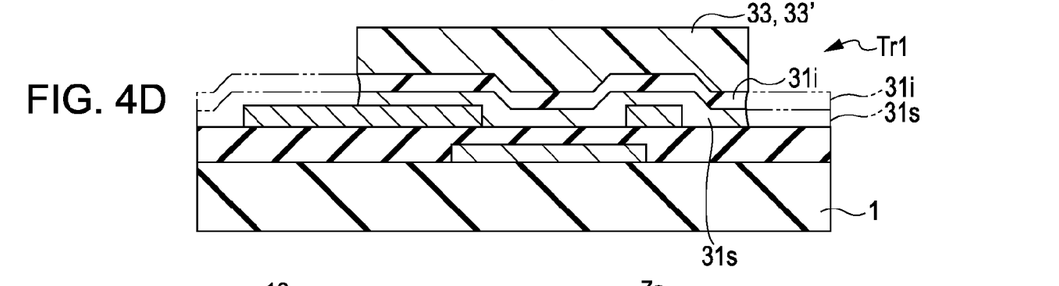

Referring then to FIG. 4D, the insulating layer 31i and the organic semiconductor layer 31s are patterned by dissolving them in the organic solvent A using the protective pattern 33 as a mask. The organic solvent A used is one that dissolves the insulating layer 31i and the organic semiconductor layer 31s but does not dissolve the protective pattern 33, for example, toluene.

In this step, the organic solvent A is supplied to the insulating layer 31i and the organic semiconductor layer 31s by a method such as dipping, spin coating, or spraying. The organic semiconductor material and the organic material can be collected for reuse from the organic solvent A in which the insulating layer 31i and the organic semiconductor layer 31s are dissolved by purification.

Thus, the bottom-contact, bottom-gate thin-film transistor Tr1 is formed on the substrate 1. The thin-film transistor Tr1 is isolated from other thin-film transistors and other devices formed on the substrate 1 using the organic semiconductor layer 31s.

Figure 4E:
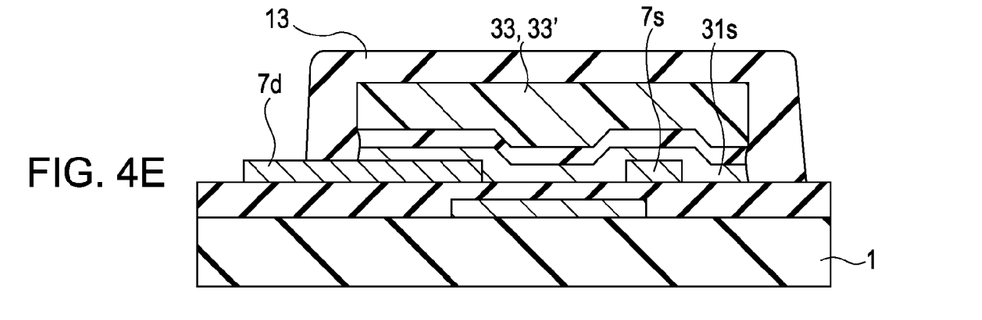

Referring then to FIG. 4E, as in the first embodiment, while the protective pattern 33 is left where appropriate, the insulating protective film 13 may be formed in a pattern covering the protective pattern 33 and the side surfaces of the organic semiconductor layer 31s. In the formation of the protective film 13, the protective pattern 33 serves as a mask to prevent damage to the organic semiconductor layer 31s. Accordingly, the protective film 13 may be formed by any method. In addition, the protective film 13 is formed in a pattern in which an appropriate portion of the source electrode 7s, the drain electrode 7d, or an electrode line formed of the same layer as the source electrode 7s and the drain electrode 7d is exposed. In this embodiment, for example, the pattern of the protective film 13 is formed by printing.

Thereafter, in the same manner as described in the first embodiment using FIG. 2, an interlayer insulator is formed so as to cover the entire surface of the substrate 1, a via hole is formed in the interlayer insulator so as to reach the drain electrode 7d, and an interconnect line is formed as a third layer on the interlayer insulator. Thus, a semiconductor device is completed. If the semiconductor device is used as a backplane of a display, the interconnect line may be formed as a pixel electrode.

As described above using FIG. 4D, the third embodiment employs a procedure in which the organic semiconductor layer 31s formed on the substrate 1 is patterned by dissolving it using the protective pattern 33 as a mask. Accordingly, as in the first embodiment, a pattern of organic semiconductor layer 31s having uniform surface condition and film quality can be formed. As a result, the semiconductor device can be isolated while ensuring excellent characteristics.

Modification of Third Embodiment

The modification of the first embodiment can also be applied to the third embodiment described above. In this case, it is important to form a protective pattern 33' in the step described using FIG. 4C using a material having a higher sublimation temperature than the insulating layer 31i and the organic semiconductor layer 31s previously formed.

In the next step shown in FIG. 4D, as in the modification of the first embodiment, the insulating layer 31i and the organic semiconductor layer 31s are patterned by subliming them at a temperature lower than the sublimation temperature of the protective pattern 33' using the protective pattern 33' as a mask.

Thereafter, as in the first embodiment, a semiconductor device including the bottom-contact, bottom-gate thin-film transistor Tr1 is completed.

As described above using FIG. 4D, the modification of the third embodiment employs a procedure in which the organic semiconductor layer 31s formed on the substrate 1 is patterned by subliming it using the protective pattern 33' as a mask. Accordingly, as in the first embodiment, a pattern of organic semiconductor layer 31s having uniform surface condition and film quality can be formed. As a result, the semiconductor device can be isolated while ensuring excellent characteristics.

4. Fourth Embodiment

FIGS. 5A to 5F are sectional views illustrating the steps of a method for producing a semiconductor device including a top-contact, bottom-gate thin-film transistor according to a fourth embodiment. The fourth embodiment will now be described with reference to the drawings.

Figure 5A:
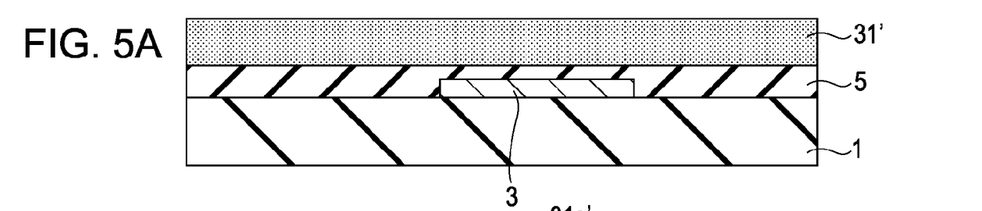
FIGS. 5A to 5F are sectional views illustrating the steps of a method for producing a semiconductor device according to a fourth embodiment.

Referring to FIG. 5A, first, by a common procedure, as in the other embodiments, the gate electrode 3 is formed on the substrate 1, and the gate insulator 5 is formed so as to cover the gate electrode 3.

Subsequently, a mixed ink layer 31' containing an organic semiconductor material is formed on the gate insulator 5. As in the third embodiment, the mixed ink layer 31' contains the intended organic semiconductor material and an organic insulating material (mixed material). The combination of these materials is selected so that the organic insulating material is separated downward toward the gate insulator 5 (substrate 1) in the subsequent phase separation step. In this embodiment, the organic semiconductor material used is perixanthenoxanthene (PXX), and the organic material used is poly-α-methylstyrene (PaMS). The mixed ink layer 31' is formed by coating using an ink prepared by dissolving the above materials in toluene.

Figure 5B:
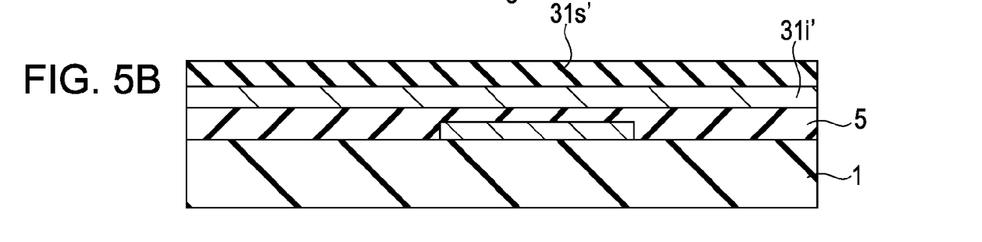

Referring then to FIG. 5B, the mixed ink layer 31' is subjected to phase separation into the organic semiconductor material and the organic insulating material, thus forming a stack of an insulating layer 31i', formed of the organic insulating material, on the substrate 1 side and an organic semiconductor layer 31s', formed of the organic semiconductor material, on top of the insulating layer 31i'. The phase separation is performed by drying the mixed ink layer 31'. The insulating layer 31i' formed by phase separation constitutes part of the gate insulator of the thin-film transistor together with the gate insulator 5.

Figure 5C:
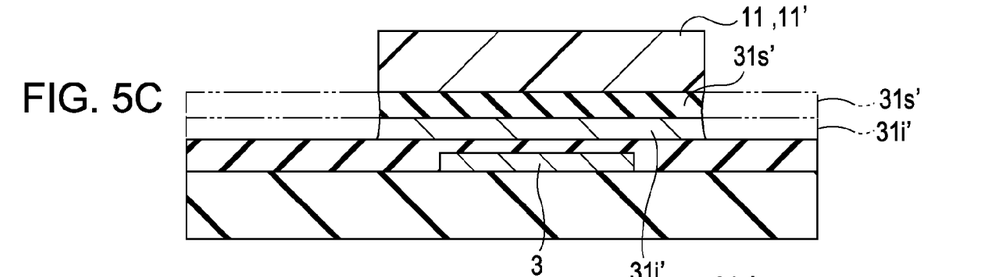

Referring then to FIG. 5C, the protective pattern 11 is formed on the organic semiconductor layer 31s' so as to overlap the gate electrode 3. As in the first embodiment, it is important to form the protective pattern 11 without damaging the organic semiconductor layer 31s', and the protective pattern 11 is formed by printing using a solvent B that does not dissolve or degrade the organic semiconductor layer 31s'. For example, if the solvent B used is water, the protective pattern 11 is formed by printing using a water-based resin such as poly(vinyl alcohol) (PVA) or cyanoethylpullulan (CyEPL). On the other hand, if the solvent B used is a fluorinated solvent, the protective pattern 11 is formed by printing using an amorphous fluoropolymer such as CYTOP (registered trademark). By printing, the protective pattern 11 can be formed at high throughput and low cost. In particular, by dry stamping, a thin and fine protective pattern 11 can be formed.

Subsequently, the organic semiconductor layer 31s' is patterned by dissolving it in the organic solvent A using the protective pattern 11 as a mask. If the organic semiconductor layer 31s' is formed of PXX, the organic semiconductor layer 31s' is patterned by dissolving it using 1,2,3,4-tetrahydronaphthalene as the organic solvent A. In this step, for example, the organic solvent A is supplied to the organic semiconductor layer 31s' by a method such as dipping, spin coating, or spraying. In this step, the insulating layer 31i' may be patterned together with the organic semiconductor layer 31s'. The organic semiconductor material can be collected for reuse from the organic solvent A in which the organic semiconductor layer 31s' is dissolved by purification.

Figure 5D:
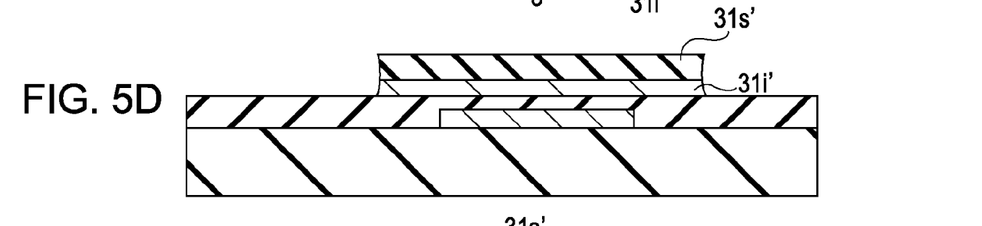

Referring then to FIG. 5D, after the patterning of the organic semiconductor layer 31s', the protective pattern 11 is removed. In this step, the solvent B described above is used to remove the protective pattern 11 by dissolving it in the solvent B without damaging the organic semiconductor layer 31s' and the insulating layer 31i'. In this step, any solvent that can dissolve the protective pattern 11 without damaging the organic semiconductor layer 31s' may be used instead of the solvent B used for printing to remove the protective pattern 11.

Figure 5E:
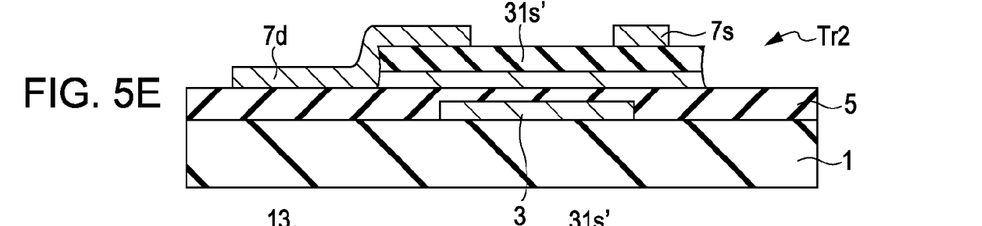
Figure 5F:
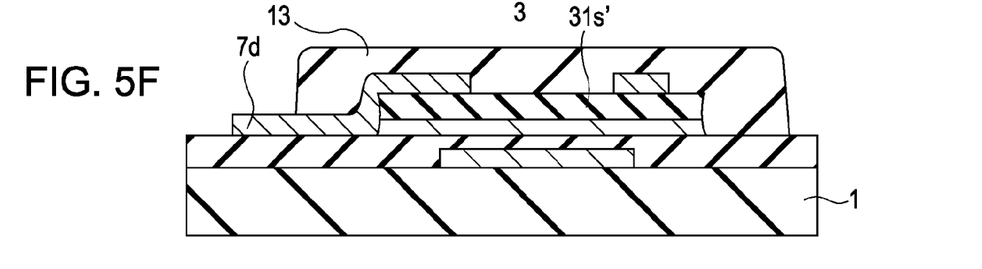

Referring then to FIG. 5E, the source electrode 7s and the drain electrode 7d are formed. The source electrode 7s and the drain electrode 7d are formed on the organic semiconductor layer 31s' such that the respective edges thereof face each other with the gate electrode 3 therebetween on both sides of the gate electrode 3 in the width direction thereof. The source electrode 7s and the drain electrode 7d can be formed by printing or another patterning process, such as metal evaporation using a metal mask or screen printing using a silver (Ag) paste.

Thus, the top-contact, bottom-gate thin-film transistor Tr2 is formed on the substrate 1. The thin-film transistor Tr2 is isolated from other thin-film transistors and other devices formed on the substrate 1 using the organic semiconductor layer 31s'.

Thereafter, in the same manner as described in the first embodiment using FIGS. 1E and 2, the insulating protective film 13 may be formed so as to cover the organic semiconductor layer 31s'. An interlayer insulator is then formed so as to cover the entire surface of the substrate 1, a via hole is formed in the interlayer insulator so as to reach the drain electrode 7d, and an interconnect line is formed as a third layer on the interlayer insulator. Thus, a semiconductor device is completed. If the semiconductor device is used as a backplane of a display, the interconnect line may be formed as a pixel electrode.

As described above using FIG. 5C, the fourth embodiment employs a procedure in which the organic semiconductor layer 31s' formed on the substrate 1 is patterned by dissolving it using the protective pattern 11 as a mask. Accordingly, as in the first embodiment, a pattern of organic semiconductor layer 31s' having uniform surface condition and film quality can be formed. As a result, the semiconductor device can be isolated while ensuring excellent characteristics.

Modification of Fourth Embodiment

The modification of the first embodiment can also be applied to the fourth embodiment described above. In this case, it is important to form the protective pattern 11' in the step described using FIG. 5C using a material having a higher sublimation temperature than the insulating layer 31i' and the organic semiconductor layer 31s' previously formed.

Subsequently, as in the modifications of the other embodiments, the insulating layer 31i' and the organic semiconductor layer 31s' are patterned by subliming them at a temperature lower than the sublimation temperature of the protective pattern 11' using the protective pattern 11' as a mask.

Thereafter, as in the first embodiment, a semiconductor device including the top-contact, bottom-gate thin-film transistor Tr2 is completed.

As described above using FIG. 5C, the modification of the fourth embodiment employs a procedure in which the organic semiconductor layer 31s' formed on the substrate 1 is patterned by subliming it using the protective pattern 11' as a mask. Accordingly, as in the first embodiment, a pattern of organic semiconductor layer 31s' having uniform surface condition and film quality can be formed. As a result, the semiconductor device can be isolated while ensuring excellent characteristics.

5. Fifth Embodiment

FIGS. 6A to 6E are sectional views illustrating the steps of a method for producing a semiconductor device including a bottom-contact, bottom-gate thin-film transistor according to a fifth embodiment. The fifth embodiment differs from the first embodiment in that a protective film is provided below a protective pattern to form a double-layer structure. The fifth embodiment will now be described with reference to the drawings.

Figure 6A:
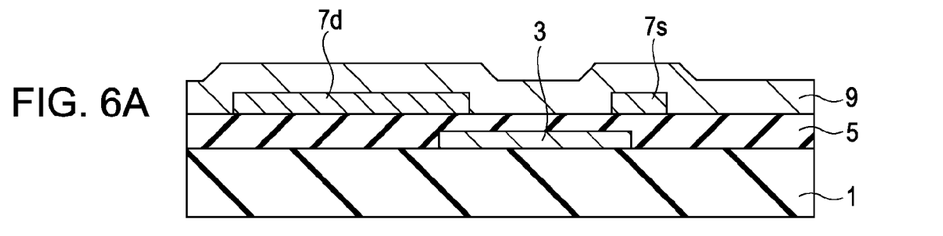
FIGS. 6A to 6E are sectional views illustrating the steps of a method for producing a semiconductor device according to a fifth embodiment.

Referring to FIG. 6A, first, by a common procedure, as in the first embodiment, the gate electrode 3 is formed on the substrate 1, the gate insulator 5 is formed so as to cover the gate electrode 3, the source electrode 7s and the drain electrode 7d are formed, and the organic semiconductor layer 9 is formed so as to cover the source electrode 7s and the drain electrode 7d. In this embodiment, for example, the organic semiconductor layer 9 is formed by coating using an ink prepared by dissolving TIPS pentacene in ethanol.

Figure 6B:
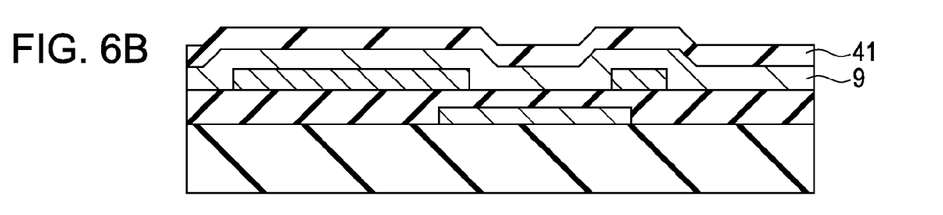

Referring then to FIG. 6B, a protective film 41 is formed so as to cover the entire surface of the organic semiconductor layer 9. In this step, it is important to form the protective film 41 without damaging the organic semiconductor layer 9 previously formed. Accordingly, for example, the protective film 41 is formed by coating or printing using a solvent B that does not dissolve or degrade the organic semiconductor layer 9 and a material soluble in the solvent B.

The solvent B used may be water or a fluorinated solvent. If the solvent B used is water, the protective film 41 is formed by printing using a water-based resin such as poly(vinyl alcohol) (PVA) or cyanoethylpullulan (CyEPL). On the other hand, if the solvent B used is a fluorinated solvent, the protective pattern 41 is formed by printing using an amorphous fluoropolymer such as CYTOP (registered trademark).

In this embodiment, for example, the protective film 41 is formed by coating using an aqueous PVA solution as an ink solution.

Figure 6C:
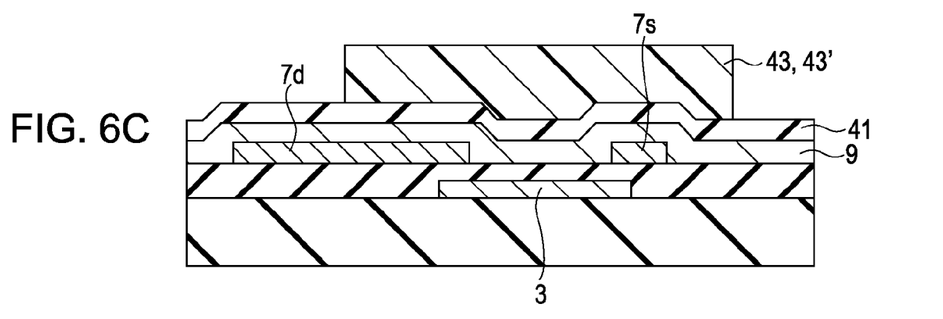

Referring then to FIG. 6C, a protective pattern 43 is formed on the protective film 41 so as to overlap the gate electrode 3 between the source electrode 7s and the drain electrode 7d. During this step, the organic semiconductor layer 9 is protected by the protective film 41. Accordingly, the protective pattern 43 may be formed without taking into account process damage to the organic semiconductor layer 9. That is, the protective pattern 43 may be formed of a material resistant to the subsequent process of removing the protective film 41 and the organic semiconductor layer 9.

The protective pattern 43 is formed by, for example, printing. In this embodiment, for example, the protective pattern 43 is formed by printing using an ink prepared by dissolving polystyrene (PS) in toluene. The printing process used in this step is not particularly limited, and an appropriate printing process may be selected from, for example, screen printing, flexography, gravure printing, offset printing, inkjet printing, and dry stamping. By printing, the protective pattern 43 can be formed at high throughput and low cost. In particular, by dry stamping, a thin and fine protective pattern 43 can be formed and, if the protective pattern 43 is left, the upper layers can be easily formed because the protective pattern 43 is thin and flat.

Figure 6D:
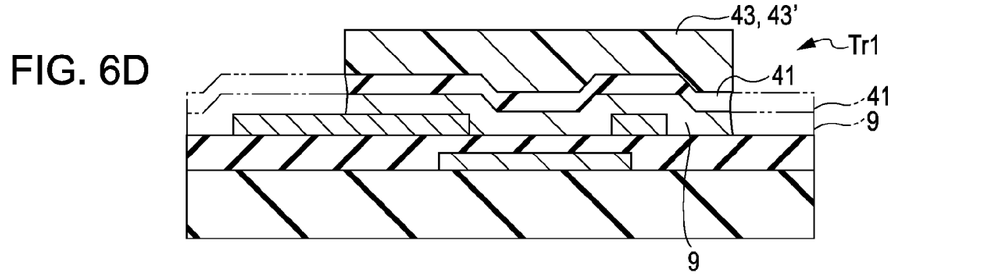

Referring then to FIG. 6D, the protective film 41, formed of PVA, is patterned by dissolving it in water using the protective pattern 43 as a mask. The organic semiconductor layer 9, formed of TIPS pentacene, is then patterned by dissolving it in ethanol (organic solvent A) using the protective pattern 43 as a mask.

In this step, water and ethanol (organic solvent A) are supplied to the protective film 41 and the organic semiconductor layer 9, respectively, by a method such as dipping, spin coating, or spraying. The organic semiconductor material can be collected for reuse from the organic solvent A in which the organic semiconductor layer 9 is dissolved by purification.

Thus, the bottom-contact, bottom-gate thin-film transistor Tr1 is formed on the substrate 1. The thin-film transistor Tr1 is isolated from other thin-film transistors and other devices formed on the substrate 1 using the organic semiconductor layer 9.

Figure 6E:
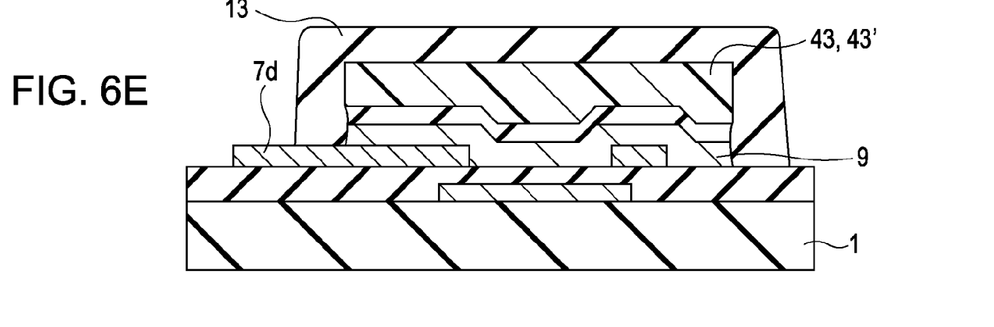

Thereafter, as in the other embodiments, for example, as in FIG. 6E, while the protective pattern 41 is left on the organic semiconductor layer 9 where appropriate, the insulating protective film 13 may be formed in a pattern covering the side surfaces of the organic semiconductor layer 9. An interlayer insulator is then formed so as to cover the entire surface of the substrate 1, a via hole is formed in the interlayer insulator so as to reach the drain electrode 7d, and an interconnect line is formed as a third layer on the interlayer insulator. Thus, a semiconductor device is completed. If the semiconductor device is used as a backplane of a display, the interconnect line may be formed as a pixel electrode.

As described above using FIG. 6D, the fifth embodiment employs a procedure in which the organic semiconductor layer 9 formed on the substrate 1 is patterned by dissolving it using the protective pattern 43 as a mask. Accordingly, as in the first embodiment, a pattern of organic semiconductor layer 9 having uniform surface condition and film quality can be formed. As a result, the semiconductor device can be isolated while ensuring excellent characteristics.

Modification of Fifth Embodiment

The modification of the first embodiment can also be applied to the fifth embodiment described above. In this case, it is important to form an organic semiconductor layer 43' in the step described using FIG. 6C using a material having a higher sublimation temperature than the protective film 41 and the organic semiconductor layer 9 previously formed.

In the next step shown in FIG. 6D, as in the modification of the first embodiment, the protective film 41 and the organic semiconductor layer 9 are patterned by subliming them at a temperature lower than the sublimation temperature of the protective pattern 43' using the protective pattern 43' as a mask.

Thereafter, as in the first embodiment, a semiconductor device including the bottom-contact, bottom-gate thin-film transistor Tr1 is completed.

As described above using FIG. 6D, the modification of the fifth embodiment employs a procedure in which the organic semiconductor layer 9 formed on the substrate 1 is patterned by subliming it using the protective pattern 43' as a mask. Accordingly, as in the first embodiment, a pattern of organic semiconductor layer 9 having uniform surface condition and film quality can be formed. As a result, the semiconductor device can be isolated while ensuring excellent characteristics.

Whereas the present application is applied to methods for producing semiconductor devices including bottom-gate thin-film transistors in the embodiments and modifications described above, the present application is not limited thereto. That is, the present application can be applied to a wide variety of methods for producing semiconductor devices including a step of patterning an organic semiconductor layer, for example, to a method for producing a semiconductor device including a top-gate thin-film transistor or a method for producing a semiconductor device including a photodetector.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A method for producing a semiconductor device, comprising:

forming a gate electrode on a substrate;

forming a gate insulating film on the gate electrode and the substrate;

forming an organic semiconductor layer on the substrate;

forming a protective pattern on the organic semiconductor layer; and patterning the organic semiconductor layer by dissolving, in an organic solvent, or subliming the organic semiconductor layer using the protective pattern as a mask, the organic semiconductor layer being formed directly on the gate insulating film in a first area between a source electrode and a drain electrode, and in a second area extending beyond an outer edge of the source electrode;

forming an insulating protective film that directly contacts each of a first portion of the drain electrode, the protective pattern, side surfaces of the patterned organic semiconductor layer and the protective pattern, and the gate insulating film, respectively;

forming an interlayer insulator that is separate from the insulating protective film and that directly contacts a second portion of the drain electrode and is formed over the entire surface of the substrate;

forming a via hole in the interlayer insulator disposed in the second portion of the drain electrode so as to reach the drain electrode, wherein the first portion of the drain electrode is disposed between the second portion of the drain electrode and the side surface of the patterned organic semiconductor layer; and forming an interconnect line on the interlayer insulator.

2. The method for producing a semiconductor device according to claim 1, wherein of forming the protective pattern includes forming the protective pattern by printing.

3. The method for producing a semiconductor device according to claim 1, wherein
forming the protective pattern includes forming the protective pattern using a material having a higher sublimation temperature than the organic semiconductor layer; and
patterning the organic semiconductor layer includes subliming the organic semiconductor layer at a temperature lower than the sublimation temperature of the protective pattern.

4. The method for producing a semiconductor device according to claim 3, further comprising selectively removing the protective pattern from the organic semiconductor layer after patterning the organic semiconductor layer.

5. The method for producing a semiconductor device according to claim 1, wherein patterning the organic semiconductor layer includes:
dissolving the organic semiconductor layer in an organic solvent; and
collecting an organic semiconductor material from the organic solvent in which the organic semiconductor layer is dissolved.

6. The method for producing a semiconductor device according to claim 1, wherein patterning the organic semiconductor layer includes:
subliming the organic semiconductor layer; and
collecting a constituent material sublimed from the organic semiconductor layer.

7. The method for producing a semiconductor device according to claim 1, wherein the organic solvent is 1,2,3,4-tetrahydronaphthalene, and the organic semiconductor layer is formed using ethylphenylperixanthenoxanthene (EtPh-PXX).

8. The method for producing a semiconductor device according to claim 1, wherein the protective pattern is formed of a fluoropolymer or a water-soluble polymer.

9. The method for producing a semiconductor device according to claim 1, wherein the protective pattern is formed by printing using a water-based resin.

10. The method for producing a semiconductor device according to claim 9, wherein the water-based resin is poly(vinyl alcohol) (PVA) or cyanoethylpullulan (CyEPL).

11. The method for producing a semiconductor device according to claim 1, wherein the organic solvent is a fluorinated solvent, and the protective pattern is formed by using CYTOP.

12. The method for producing a semiconductor device according to claim 1, wherein the protective pattern is formed of poly(vinyl alcohol) (PVA) and the organic semiconductor layer is formed of pentacene.

13. The method for producing a semiconductor device according to claim 1, wherein the protective pattern has a flat upper surface.

* * * * *